(12) United States Patent
Frey et al.

(10) Patent No.: US 9,741,879 B2
(45) Date of Patent: Aug. 22, 2017

(54) SPAD PHOTODIODE COVERED WITH A NETWORK

(71) Applicant: Commissariat a L'Energie Atomique et aux Energies Alternatives, Paris (FR)

(72) Inventors: Laurent Frey, Fontaine (FR); Norbert Moussy, Sainte-Agnes (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/179,101

(22) Filed: Jun. 10, 2016

(65) Prior Publication Data
US 2016/0365464 A1 Dec. 15, 2016

(30) Foreign Application Priority Data

Jun. 11, 2015 (FR) ..................... 15 55326

(51) Int. Cl.
| | |
|---|---|
| *H01L 31/0232* | (2014.01) |
| *H01L 31/107* | (2006.01) |
| *H01L 27/144* | (2006.01) |
| *H01L 31/18* | (2006.01) |

(52) U.S. Cl.
CPC .... *H01L 31/02327* (2013.01); *H01L 27/1446* (2013.01); *H01L 31/107* (2013.01); *H01L 31/1804* (2013.01)

(58) Field of Classification Search
CPC ............. H01L 31/02327; H01L 31/107; H01L 31/1804; H01L 27/1446
USPC ........................................................ 257/432
See application file for complete search history.

(56) References Cited

U.S. PATENT DOCUMENTS

| | | | |
|---|---|---|---|
| 5,146,296 A * | 9/1992 | Huth ....................... | H01J 31/26 257/429 |
| 6,230,057 B1 * | 5/2001 | Chow ....................... | A61F 9/08 607/116 |
| 2003/0234409 A1 * | 12/2003 | Toma ................ | H01L 27/14806 257/222 |

(Continued)

FOREIGN PATENT DOCUMENTS

CN    102881761    12/2014

OTHER PUBLICATIONS

French Preliminary Search Report issued May 4, 2016 in French Application 15 55326, filed Jun. 11, 2015 (with English Translation of Categories of Cited Documents).

(Continued)

*Primary Examiner* — Tu-Tu Ho
(74) *Attorney, Agent, or Firm* — Oblon, McClelland, Maier & Neustadt, L.L.P.

(57) ABSTRACT

The invention relates to a single-photon avalanche diode (SPAD) photodiode having a layer made of semiconductor material, including an N doped zone and a P doped zone separated by an avalanche zone. The semiconductor material layer is intercalated between a periodic structure and a low index layer having a refractive index less than that of the semiconductor material layer and less than that of the periodic structure. The periodic structure is deposited directly on the semiconductor material layer. The photodiode provides low temporal dispersion and high quantum efficiency, without requiring a strong charge acceleration voltage.

17 Claims, 5 Drawing Sheets

(56) References Cited

U.S. PATENT DOCUMENTS

| | | | |
|---|---|---|---|
| 2005/0062041 A1* | 3/2005 | Terakawa | H01L 31/0747 257/53 |
| 2005/0200942 A1* | 9/2005 | Grot | G02B 6/1225 359/321 |
| 2007/0091953 A1* | 4/2007 | Ledentsov | H01L 33/105 372/43.01 |
| 2011/0018086 A1* | 1/2011 | Linga | H01L 31/1075 257/438 |
| 2011/0241149 A1 | 10/2011 | Mazzillo et al. | |
| 2012/0164399 A1 | 6/2012 | Rey et al. | |
| 2014/0034835 A1 | 2/2014 | Frey et al. | |
| 2015/0053924 A1 | 2/2015 | Marty et al. | |

OTHER PUBLICATIONS

Songhao Liu et al. "Photonic Technology in Quantum Information Challenges Quantum Limitation", Quantum Optics, Optical Data Storage, and Advanced Microlithography, Proc. of SPIE. vol. 6827, Nov. 11, 2007, 12 pages.

Stefan Vasile et al. "Challenges of Developing Resonant Cavity Photon-Counting Detectors at 1064nm", Free-Space Laser Communication Technologies XXII, Proc. of SPIE. vol. 7587, Jan. 23, 2010, 8 pages.

\* cited by examiner

SPAD PHOTODIODE COVERED WITH A NETWORK

TECHNICAL FIELD

The present invention relates to the field of photodiodes, in particular SPAD type photodiodes.

STATE OF THE PRIOR ART

A photodiode is a light sensitive component, including a layer made of semiconductor having an N doped zone (having an excess of electrons) and a P doped zone (having a deficiency of electrons). The N doped zone and the P doped zone are separated by a PN junction, at the level of which a depletion zone forms, also known as space charge zone. Each N or P doped zone is connected to an electrical connector, in order to polarise the diode. A photon absorbed by the semiconductor material layer generates an electron-hole pair, that is to say a positive electric charge and a negative electric charge.

In a so-called SPAD (single-photon avalanche diode) photodiode, a reverse polarisation is applied between the N doped zone and the P doped zone. The polarisation voltage is preferably greater than (or equal to), in absolute value, the breakdown voltage of the photodiode (minimum reverse electrical voltage that makes it conducting in the blocking sense). This polarisation creates a strong electric field at the level of the PN junction, which accelerates the photo-generated electrical charges. These charges have sufficient energy to excite by impact other electrical charges (impact ionisation). This chain reaction is called avalanche effect, and takes place in a so-called avalanche zone between the N doped zone and the P doped zone. Thus, the absorption of a photon generates a brief and intense electrical signal, called useful electrical signal. A SPAD type photodiode thus makes it possible to detect with great precision light signals of very weak intensity and to date the arrival of each photon. A SPAD type photodiode is also called Geiger mode avalanche photodiode.

If the photon is absorbed in the avalanche zone, the electron-hole pair immediately triggers the avalanche effect. If the photon is absorbed outside of the avalanche zone, the minority charge of the electron-hole pair can diffuse into the semiconductor material layer then reach the avalanche zone where it triggers the avalanche effect.

The temporal resolution of the useful electric signal is thus limited by the uncertainty regarding the precise location where the photon is absorbed and where the electron-hole pair forms. In other words, the transit time of the generated carrier, up to the avalanche zone, is not known with precision, which limits the temporal resolution of the detection of photons. This temporal dispersion is also known as photodiode "jitter".

It could be envisaged to reduce the thickness of the photodiode, to a thickness close to that of the avalanche zone. However, the avalanche zone generally has a very small thickness, typically of the order of 0.3 µm. This solution thus does not make it possible to absorb sufficiently photons to provide the photodiode with satisfactory sensitivity. In fact, a certain thickness of material is necessary to absorb the light, this thickness depending on the wavelength considered and increasing in going towards the infrared, notably for silicon. For example, a thickness of silicon greater than 1 µm is necessary to absorb efficiently the near infrared in silicon.

A known solution to provide both good temporal resolution and high sensitivity thus consists in increasing the thickness of semiconductor material in order to absorb efficiently the incident photons, and accelerate the migrating carriers towards the avalanche zone in order to reduce "jitter". To accelerate the carriers towards the avalanche zone, an electric field is created in the entire thickness of the semiconductor material layer. This is done by lowering the average doping level of the semiconductor material, and by increasing (in absolute value) the polarisation voltage at the terminals of the diode.

A drawback of this solution is that it requires the use of very high polarisation voltages.

An objective of the present invention is to propose a SPAD type photodiode having high sensitivity, and which does not have at least one of the drawbacks of the prior art.

In particular, an aim of the present invention is to propose a SPAD type photodiode having both high sensitivity in long wavelengths (greater than 600 nm, and even 800 nm) and low jitter.

DESCRIPTION OF THE INVENTION

This objective is reached with a SPAD type photodiode, having a layer made of semiconductor material including an N doped zone and a P doped zone, separated by an avalanche zone.

According to the invention, the photodiode further includes:
    a first so-called low index layer; and
    a periodic structure having a plurality of elementary patterns;
the first low index layer having a refractive index less than that of the semiconductor material layer and than that of the periodic structure, and the semiconductor material layer being intercalated between the first low index layer and the periodic structure.

According to the invention, the periodic structure is advantageously deposited directly on the semiconductor material layer.

Moreover, the elementary patterns of the periodic structure are formed preferably by a plurality of pads regularly spaced apart from each other.

Preferably, the P doped zone and the N doped zone each extend in one piece under the assembly of the periodic structure.

Preferably, the periodic structure includes a plurality of pads regularly spaced apart, the spaces between the pads being at least partially filled with a material known as low index material, having a refractive index less than that of the semiconductor material layer and than that of the periodic structure.

In a variant, the spaces between the pads are filled totally or partially with a gas such as air.

Whatever the case, in both cases the average refractive index between the pads is less than the refractive index of the pads, the difference between the two being greater than or equal to 0.5 or even greater than or equal to 1.

The periodic structure may be formed in a same semiconductor material block as the semiconductor material layer.

In a variant, the periodic structure may be formed in a poly-crystalline silicon layer deposited on the semiconductor material layer.

Whatever the case, the photodiode is configured to detect an electromagnetic radiation, which passes through the periodic structure before reaching the semiconductor material layer.

The invention equally relates to an array of at least two photodiodes in which:
- each periodic structure includes a plurality of pads regularly spaced apart, the spaces between the pads being at least partially filled with a material known as low index material, having a refractive index less than that of the semiconductor material layer and than that of the periodic structure; and
- the neighbouring periodic structures are separated by trenches filled with said low index material.

The invention also relates to a method of manufacturing a photodiode according to the invention, including a step of structuring an upper region of a semiconductor material block, to form an assembly constituted of the periodic structure mounted on the semiconductor material layer.

The invention equally relates to a method of manufacturing an array of photodiodes according to the invention, including the following steps:
- structuring an upper region of a semiconductor material block, to form an assembly constituted of a plurality of periodic structures mounted on a semiconductor material layer;
- etching of trenches between two neighbouring periodic structures, the steps of etching of trenches and structuring being carried out by a single etching step; and
- deposition of the low index material, filling the trenches and the spaces between the pads forming the periodic structures, said low index material having a refractive index less than that of the semiconductor material block.

BRIEF DESCRIPTION OF THE DRAWINGS

The present invention will be better understood on reading the description of examples of embodiment given for purely indicative purposes and in no way limiting, while referring to the appended drawings, in which.

DETAILED DESCRIPTION OF PARTICULAR EMBODIMENTS

Figure 1:
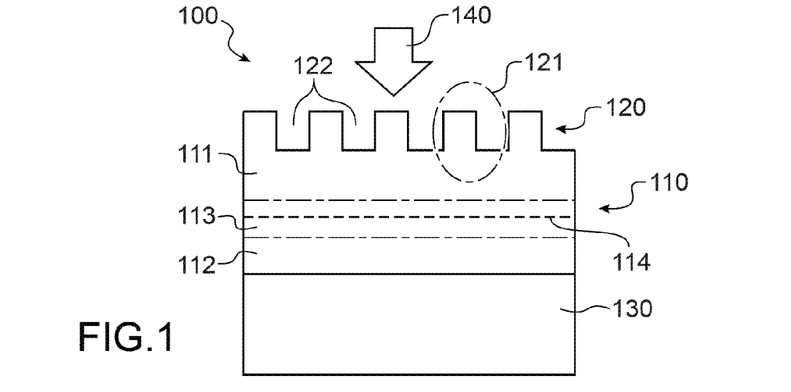
FIG. 1 schematically illustrates a first embodiment of a photodiode according to the invention.

The invention will firstly be illustrated with the aid of FIG. 1, schematically illustrating a first embodiment of a photodiode 100 according to the invention.

The photodiode 100 is suited to detecting an electromagnetic radiation at wavelengths in the red and near infrared, notably comprised between 600 nm and 1000 nm. Hereafter, the example of a photodiode suited to detecting an electromagnetic radiation at 850 nm will be taken.

The photodiode 100 has a semiconductor material layer 110, having an N doped zone 111 and a P doped zone 112. The N doped zone 111 and the P doped zone 112 are superimposed, and separated by a PN junction 114. An avalanche zone 113 (represented between two mixed lines) extends into and around the PN junction. In a variant, the zone 111 is P doped, and the zone 112 is N doped.

The photodiode 100 is of SPAD type, suited to being reverse polarised by a polarisation voltage greater than the breakdown voltage, for example comprised between 1 and 3 times the breakdown voltage. In particular, the N doped zone 111 is connected to a first electrical connector (not represented) suited to being taken to a first electrical potential, and the P doped zone is connected to a second electrical connector (not represented) suited to being taken to a second electrical potential, the first and second electrical potentials together defining a voltage greater than (in absolute value) the breakdown voltage.

The semiconductor material forms an absorbing medium, constituted for example of silicon, the photodiode being suited to detecting electromagnetic radiation 140 at a wavelength of 850 nm.

A periodic structure 120 is arranged directly on the semiconductor material layer 110.

As illustrated in all of the figures, the P doped zone and the N doped zone each extend in a single piece under the assembly of the periodic structure.

This periodic structure 120 may be etched in a semiconductor material block, so as to form directly the assembly constituted of the layer 110 and the periodic structure 120. In a variant, the periodic structure 120 is made of a non-metallic material, different from that of the layer 110.

As illustrated in all of the figures, the photodiode according to the invention is configured to detect electromagnetic radiation 140, incident on the photodiode on the side of the periodic structure 120.

In other words, the photodiode is configured to detect electromagnetic radiation 140, which passes through the periodic structure 120 before reaching the semiconductor material layer 110.

The material forming the periodic structure 120 is thus essentially transparent to the wavelength that the photodiode 100 is suited to detecting. Throughout the text "essentially transparent" signifies for example "having an extinction coefficient less than several $10^{-2}$ at the working wavelength, for example $5 \cdot 10^{-2}$".

The periodic structure 120 has a plurality of elementary patterns, that is to say a plurality of pads 121 regularly spaced apart from each other. A pad here designates a solid volume of any shape, for example a cylinder, or a cube, or a cylindrical ring, or a cube pierced by a through hole (several pads then forming a grid). The shape of the pad may confer to the periodic structure a periodicity along one or two dimensions of space. In the first case, this is also known as a bar, or line. The periodic structure 120 preferably has a two-dimensional periodicity (each associated with an axis parallel to the upper surface of the photodiode). The period may be different along each of the two dimensions. This then results in a quantum efficiency which depends on the polarisation of light, which makes it possible to detect a particular polarisation. The periodic structure advantageously has at least five elementary patterns along each dimension of the space where it has a periodicity (i.e. at least 5×5 elementary patterns in the case of a periodicity along two dimensions).

The periodic structure 120 may be covered by a thin passivation layer (thermal oxide for example), which follows the shape of the elementary patterns without entirely filling the spaces, or interstices 122 between them. The optical index of this passivation layer may be any index.

The periodic structure 120 forms a sub-wavelength resonant network, the pitch being less than the wavelength in the material of the incident medium, of the electromagnetic radiation that the photodiode 100 is suited to detecting. The incident medium is that which covers the periodic structure, here air. The pitch is thus, here, less than 850 nm.

Here, this material is air (the incident medium is the medium). This pitch is notably less than 850 nm.

It may be recalled that the wavelength in a material is the wavelength in a vacuum divided by the optical index of this material.

The semiconductor material layer 110 is deposited directly on a first so-called low index layer 130, having a refractive index less than that of the layer 110 and that of the periodic structure 120. Throughout the text, refractive indices at a wavelength that the photodiode is suited to detecting, in particular at 850 nm, are considered.

The first low index layer 130 forms a lower waveguide cladding. The upper waveguide cladding is here formed by air surrounding the photodiode, and here filling the spaces 122 between the pads (or what subsists thereof after application of the thin passivation layer defined above).

The combination of this waveguide and the periodic structure 120 generates guided modes in the semiconductor material layer 110.

It has been found in a surprising manner that for certain values of geometric parameters of the photodiode (dimensions of the pads of the periodic structure 120, thicknesses of the periodic structure 120 and of the semiconductor material layer 110), the electromagnetic field is locally reinforced in regions situated inside the semiconductor material layer 110, and that this field is virtually zero in the periodic structure. In particular, the electromagnetic field is concentrated in at least one sub-layer of the semiconductor material layer 110. Those skilled in the art would have expected a more homogeneous distribution of the electromagnetic field in a multimode waveguide of high thickness (here around 5 to 10 times the wavelength in the semiconductor material layer 110, see later).

The regions in which the electromagnetic field is most intense are used to produce a SPAD type photodiode of same sensitivity and higher temporal resolution compared to a SPAD photodiode according to the prior art.

To do so, the regions where the electromagnetic field is reinforced are positioned in or near to the avalanche zone of the SPAD photodiode. Thus, the absorption of photons is reinforced in or near to the avalanche zone. It is then possible to reduce the thickness of a region of the semiconductor material situated outside of the avalanche zone, and of which the role is simply to absorb photons which will then diffuse up to the avalanche zone.

In the prior art, a SPAD photodiode detecting a radiation at 850 nm and absorbing 90% of the incident photons is constituted of a layer of silicon of 40 μm thickness. Thanks to the invention, this thickness is brought down to several micrometres only, whatever the case less than 10 μm.

Thanks to this reduced thickness, the transit time of the carriers up to the avalanche zone is reduced. It is thus possible, at equal sensitivity, both to reduce the polarisation voltage and to improve the temporal resolution of the SPAD photodiode (that is to say to reduce jitter). For example, said polarisation voltage is reduced by a factor of two (20 V instead of 40 V). A photodiode with low temporal dispersion and high quantum efficiency is obtained.

A SPAD type photodiode is used for example to measure time-of-flight, that is to say the elapsed time between the emission of a laser signal, and the detection of a backscattered signal on an object to detect. Time-of-flight measurements are commonly used in telemetry, presence detection, 3D movement recognition, etc. The invention makes it possible to increase the precision of this time-of-flight measurement. The invention further avoids having to lower the average doping level in the semiconductor material layer, which proves particularly advantageous in CMOS technology.

The reduced thickness of the semiconductor material layer also makes it possible to reduce the dark current. This advantage is found in any type of photodiode, the regions where the electromagnetic field is reinforced being positioned in or near to the PN junction.

Figure 2:
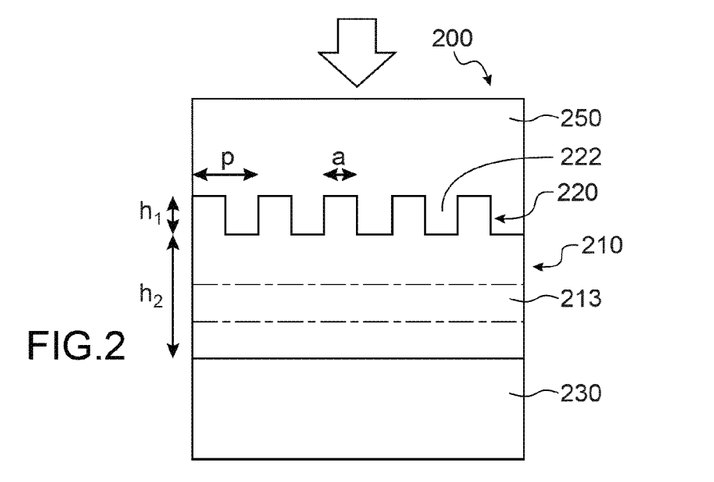
FIG. 2 schematically illustrates a second embodiment of a photodiode according to the invention.

FIG. 2 schematically illustrates a second embodiment of a photodiode 200 according to the invention. The photodiode 200 only differs from the photodiode illustrated in FIG. 1 in that the spaces 222 between the pads are filled with a low index material (solid material). The low index material has a refractive index less than that of the semiconductor material layer 210 and than that of the periodic structure 220. Preferably, this low index material is identical to the material of the first low index layer.

Preferably, the spaces 222 are entirely filled with the low index material. The low index material forms a second low index layer 250. It may constitute a passivation layer between the pads, in direct contact with the periodic structure 210.

The second low index layer 250 is essentially transparent at the wavelength that the photodiode 200 is suited to detecting.

In the example illustrated in FIG. 2, the second low index layer 250, constituted of the low index material, covers the periodic structure 210, is inserted between the pads 210 and extends above said pads.

According to a variant not represented, said second low index layer 250 is flush with the top of the pads. A third layer may then cover the assembly thereby formed, on the side of the pads. This third layer is then essentially transparent to the wavelength that the photodiode 200 is suited to detecting. This third layer may be constituted of a material having a refractive index less than that of the semiconductor material layer 210 and than that of the periodic structure 220. The third layer and the second low index layer may be constituted of different materials.

Figure 3:
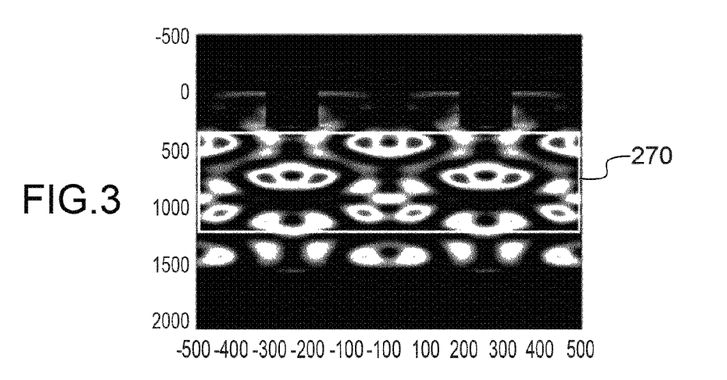
FIG. 3 illustrates a distribution of the absorption of light in the photodiode illustrated in FIG. 2.

FIG. 3 illustrates a distribution of the absorption in the photodiode 200. It may be observed that the absorption has large intensity variations, and is concentrated essentially in regions situated outside of the periodic structure 220, inside the semiconductor material layer 210 (the black and white representation loses part of the information). A white rectangle represents a sub-layer 270 of the semiconductor material layer 210, receiving the regions where the absorption is concentrated. For example, the sub-layer 270 absorbs 75% of an incident luminous flux, and has a thickness close to 1 μm. The sub-layer 270 is called high sensitivity region. The avalanche zone 213 is positioned in this sub-layer 270.

Preferential dimensions and indices of the photodiode according to the invention are described hereafter, the wavelength to detect being chosen equal to 850 nm.

The difference in index between the semiconductor material layer 210 and the first low index layer 230 is greater than 0.5, preferably greater than 1.

In the same way, the difference in index between the periodic structure 220 and the first low index layer 230 is greater than 0.5, preferably greater than 1.

When the photodiode includes a second low index layer, the same index differences are established between this second layer, and the semiconductor material layer, respectively the periodic structure.

Whatever the case, when the spaces between the pads are filled at least in part by a gas such as air, these same index differences are established between the mean index between the pads, and the semiconductor material layer, respectively the periodic structure.

For example, the semiconductor material layer and the periodic structure are made of silicon (n=3.65 to 850 nm), and the first low index layer (and if need be the second low index layer) is made of silicon dioxide (n=1.45 to 850 nm).

The first low index layer 230 advantageously has a thickness greater than 50 nm, preferably greater than 500 nm.

The thickness of the semiconductor material layer 210 is noted $h_2$. The greater this thickness, the greater the spectral density of the modes in the semiconductor material layer. A large spectral density of modes offers a high angular acceptance of the photodiode. Preferably, $h_2$ is greater than 0.7 µm when the periodic structure 220 has a periodicity along two dimensions. In this way, a quantum efficiency is obtained, averaged out over a cone of incidence angles of several tens of degrees, greater than a factor 5 to 10 compared to the prior art, over a spectral width of several hundreds of nanometres. This condition corresponds to $h_2$ greater than 1.0 µm when the periodic structure 220 has a periodicity along a single dimension.

Whatever the case, the thickness $h_2$ is greater than 0.5 µm, in order to benefit from sufficient absorption.

The thickness $h_2$ is preferably less than 3 µm.

The peak-valley height $h_1$ of the pads of the periodic structure is less than or equal to 1 µm, typically comprised between 0.1 µm and 1.0 µm.

The pads are for example cubes of side a. In a variant, they may be cylindrical pads of diameter a. In a variant, the periodic structure is formed by bars of width a, for example rectangular based parallelepipeds.

The ratio $$\frac{a}{P}$$

between the width a or the pads, and the pitch P of the periodic structure, is comprised between 0.25 and 0.80 (the width a and the pitch P being measured along the same axis). This ratio is borne out along one or two axes, depending on whether the periodic structure 220 has a periodicity along one or two dimensions.

An operation of the photodiode independent of the polarisation of the incident luminous radiation is ensured by a periodic structure 220, having a periodicity along two dimensions, and with the same dimensions of the pads considered in each of these two dimensions.

The pitch P of the periodic structure 220 is advantageously greater than the ratio $$\frac{\lambda}{n_{eff}},$$

and less than the ratio $$\frac{\lambda}{n_{ginf}},$$

with:
 λ the wavelength that the photodiode is intended to detect,
 $n_{eff}$ the actual index of the waveguide formed in the photodiode, equal as a first approximation to the refractive index of the layer 210 made of semiconductor material, and
 $n_{ginf}$, the refractive index of the first low index layer 230.

In other words, the photodiode being intended to detect a radiation at a so-called wavelength of interest, the periodic structure has a pitch P:
 greater than the ratio of the wavelength of interest divided by the refractive index of the semiconductor material layer; and
 less than the ratio of the wavelength of interest divided by the refractive index of the first low index layer.

In practice, the pitch P is generally comprised between 100 nm and 1000 nm, more preferentially between 200 nm and 700 nm. Taking the example of a first low index layer made of silicon dioxide ($SiO_2$), and a semiconductor material layer made of silicon (Si), the pitch P is comprised between 230 nm and 580 nm.

A method for determining the optimum dimensions of the photodiode according to the invention may consist in:
 setting a pitch P, within the limits specified above;
 setting a height $h_1$, known as the network depth; then
 adjusting the width a of the pads and the thickness $h=h_1+h_2$ by optimisation of a quantum efficiency calculated by digital simulation.

Figure 4:
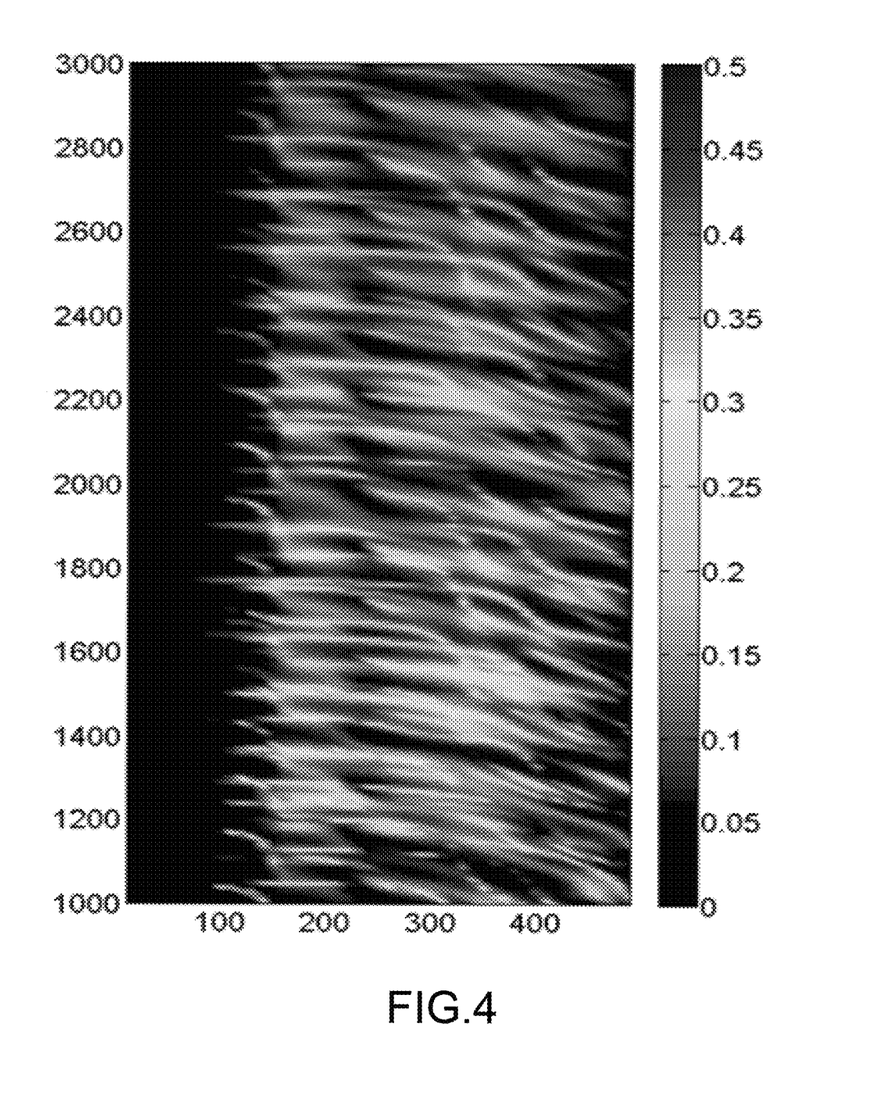
FIG. 4 illustrates the quantum efficiency in a photodiode according to the invention.

FIG. 4 represents the quantum efficiency at 850 nm in a photodiode according to the invention, as a function of the width a of the pads (x-axis) and of the thickness $h=h_1+h_2$ of the periodic structure and of the semiconductor material layer, both made of silicon. P=500 nm and $h_1$=300 nm have been set.

Couples of width a and of thickness $h=h_1+h_2$ corresponding to greater quantum efficiencies are thus identified. Preferably a couple is chosen, situated in FIG. 4, in a large zone associated with high quantum efficiencies. One thus benefits from good tolerance on the dimensions of the photodiode. Thus, h=1550 nm and a=350 nm are for example chosen. h=1550 correspond to around 5 to 10 times the wavelength in the material of the semiconductor material layer 110:

$$\frac{1550\ nm}{7} \approx \frac{\text{wavelength in a vacuum that the photodiode is suited to detecting: 850 nm}}{\text{index of silicon: 3.65}}$$

Figure 5:
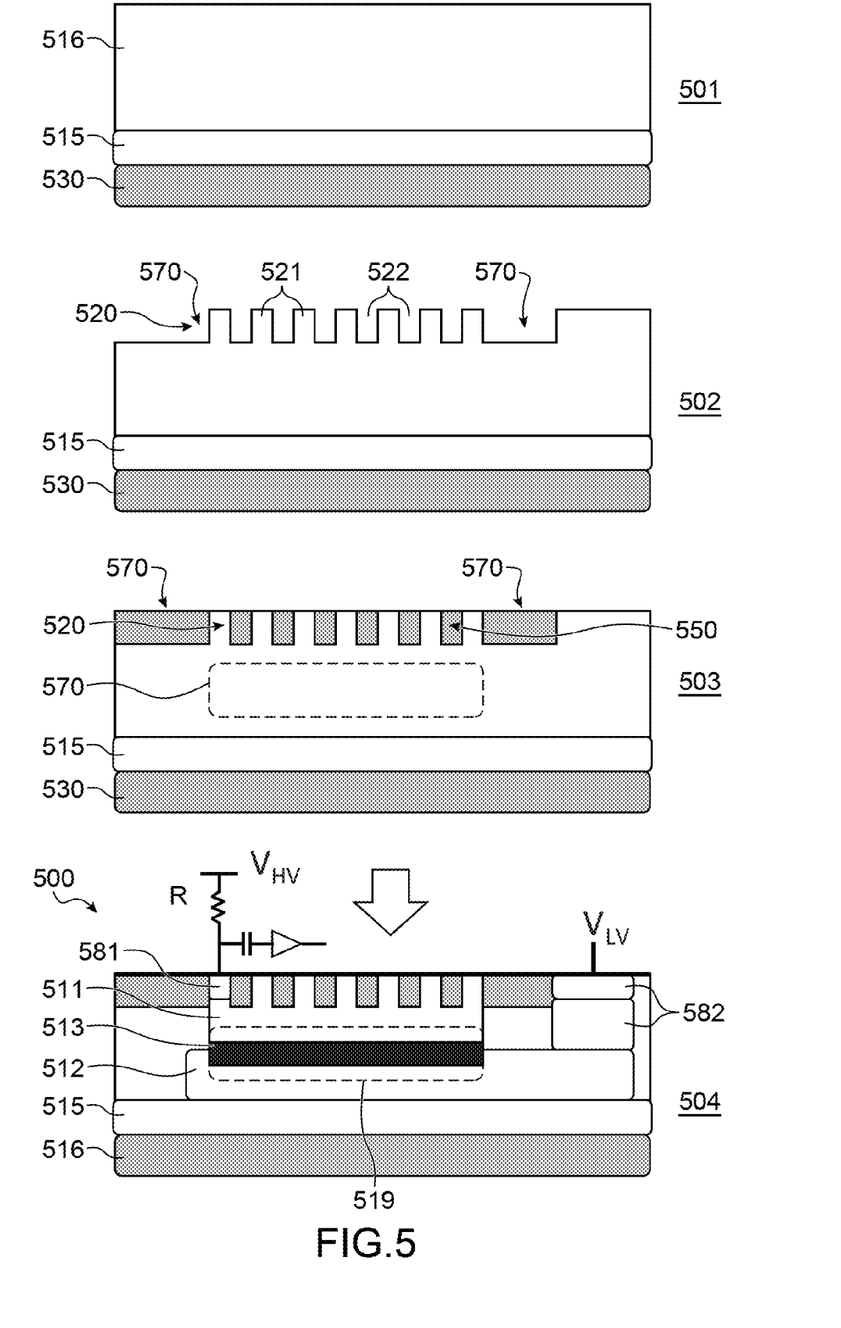
FIG. 5 illustrates a method of manufacturing an example of photodiode according to the second embodiment of the invention.

With reference to FIG. 5, a method for producing an example of a photodiode is described, as illustrated schematically in FIG. 2. Preferably, several photodiodes are manufactured simultaneously according to this method, thereby forming an array of photodiodes according to the invention.

The starting point is a silicon on insulator (SOI) substrate, formed by a thin layer of silicon on a layer of silicon dioxide. The silicon dioxide forms the first low index layer 530.

The thin layer of silicon may be thickened, then N or P doped. The layer 515 is obtained. For example, the layer 515 is thickened and has for example a doping of the same type as the doping of a doped zone that covers it in fine in the photodiode (here a P doping). In a variant, the layer 515 remains thin and has a doping of the opposite type to the doping of a doped zone that covers it in fine in the photodiode, in order to avoid the rising to the surface of carriers generated by defects of the interface between the first low index layer 530 and the silicon layer 515.

In a first step 501, a layer 516 of weakly P doped silicon is deposited by epitaxy on the layer 515. The layer 516 (and if need be the layer 515) forms a semiconductor material block.

At step 502, in a same etching step, the periodic structure 520 according to the invention and isolation trenches 570 are produced. The isolation trenches thus have a depth equal to the peak-valley height of the pads 521 of the periodic structure.

The isolation trenches 570 are intended to separate neighbouring photodiodes of a same array of photodiodes, and are called STI (Shallow Trench Isolation).

The etching of the periodic structure separates, in the silicon layer 516, a periodic structure 520 according to the invention and a layer that will form the semiconductor material layer according to the invention, after definition of the doped zones.

The step of etching isolation trenches is commonly implemented to manufacture an array of photodiodes according to the invention, such that the implementation of the invention simply makes it necessary to modify a mask used for the etching.

Preferably, the etched surfaces are passivated by a thin layer of thermal oxide.

At step 503, the isolation trenches 570 and the spaces 522 between the pads 521 of the periodic structure 520 are filled by an oxide deposited by plasma, for example silicon dioxide. This oxide forms the low index material according to the invention, situated between the pads of the periodic structure (second low index layer 550).

The high sensitivity region 570, as described with reference to FIG. 3, is surrounded by dotted lines.

In a step 504, a PN junction is produced under the periodic structure 520, and in the high sensitivity region 570.

This PN junction is formed by ion implantation, forming in the layer 516 and under the periodic structure, an N doped zone, 511, and a P doped zone, 512. In a variant, the layer 515 is thickened and strongly P doped, and the layer 516 is N doped, which forms a PN junction.

The N doped zone and the P doped zone are separated by the PN junction, at the level of which is located (after application of a suitable polarisation voltage) an avalanche zone 513.

The PN junction is preferably sufficiently far away from the periodic structure so that the avalanche zone 513 does not encroach upon the periodic structure 520. For example, the PN junction is situated at more than 200 nm under the periodic structure. To do so, the N doped zone 511 is produced by implantation for example of phosphorous between 100 and 200 keV.

The periodic structure 520 may remain non doped. In a variant, the periodic structure is N doped, like the upper doped zone 511.

The P doped zone, 512, is connected to the surface of the photodiode by strongly P doped regions P 582 formed by several successive implantations.

The N doped zone, 511, is connected to the surface of the photodiode by a single strongly N doped region 581, situated in a single pad of the periodic structure. The region 581 is formed by ion implantation at low energy, and is preferably located at the edge of the photodiode.

The N doped zone, 511, is connected to a potential $V_{HV}$, via the region 581 and a first electrical connector (not represented). The P doped zone, 512, is connected to a potential $V_{LV}$, via the regions 582 and a second electrical connector (not represented). The potential $V_{HV}$ is much greater than the potential $V_{LV}$. The electrical potentials $V_{LV}$ and $V_{HV}$ together define a polarisation voltage of the photodiode greater than its breakdown voltage, to form a SPAD type photodiode. In particular the P doped zone, 512, may be connected to earth, and the N doped zone, 511, may be connected to a voltage source through a quench resistance R serving to stop the avalanche phenomenon (R=100 kΩ for example).

The fact that the N doped zone is not connected to the potential $V_{HV}$ by each of the pads of the periodic structure also participates in stopping the avalanche phenomenon.

The measurement of the voltage at the terminals of the photodiode 500 is carried out by a follower amplifier mounting.

A variant of the photodiode described above may be produced, reversing all the N and P dopings.

The first low index layer may also be formed in a layer of silicon dioxide thicker than the insulating oxide of a standard SOI.

Figure 6:
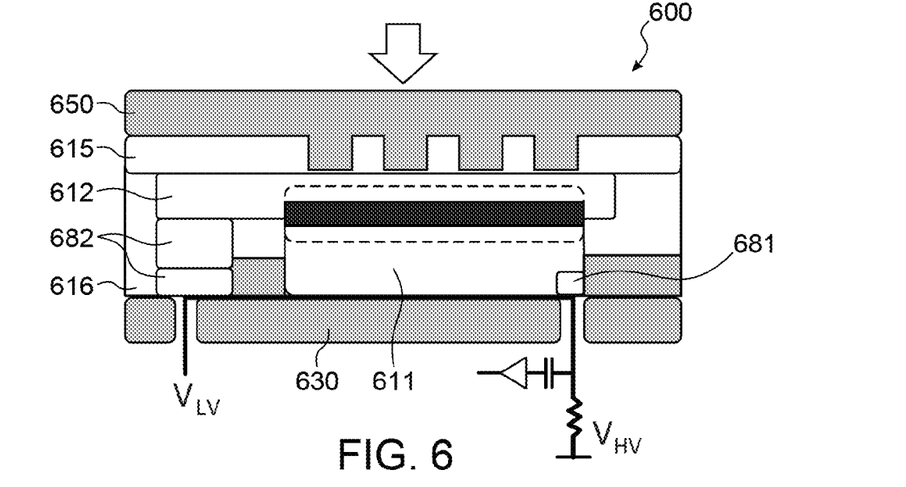
FIG. 6 illustrates a third embodiment of a photodiode according to the invention.

FIG. 6 illustrates a third embodiment of a photodiode 600 according to the invention.

The photodiode illustrated in FIG. 6 only differs from the embodiment of FIG. 5 in that it is suited to measuring photons arriving on the photodiode on the side of the initial SOI, and not on the opposite side thereto. This is known as BSI, for Back Side Illumination.

The starting point is an SOI as described with reference to FIG. 6. In this embodiment, the technological steps are carried out on the front face of an SOI, then the assembly produced is turned over.

The silicon of the SOI is thickened to form a layer of N doped silicon 615. A layer of silicon 616 is produced by epitaxy above the layer 615. Trenches are hollowed out between the future photodiodes, then filled with silicon dioxide, said silicon dioxide entirely covering the layer 615 and forming the first low index layer 630 according to the invention.

In the silicon layer 616 is produced a PN junction between an N doped zone 611 and a P doped zone 612, and strongly doped regions 681, 682 intended to connect the N doped zone 611 and the P doped zone 612 to the potential $V_{HV}$, respectively $V_{LV}$. The first low index layer 630 may be etched locally to allow electrical connectors to pass through.

Then, the stack thereby formed is turned over, and its upper surface is etched to remove the oxide from the 501 and to etch the layer of silicon 615 in order to form thereon the periodic structure 620. The periodic structure is then covered by a layer made of silicon dioxide forming the second low index layer 650.

Here, the etched faces of the periodic structure are not passivated by deposition of oxide, and the silicon layer 615 is N doped (doping of the type opposite to that of the adjacent doped zone), in order to avoid that the carriers generated by interface defects of the periodic structure diffuse up to into the avalanche zone.

Figure 7:
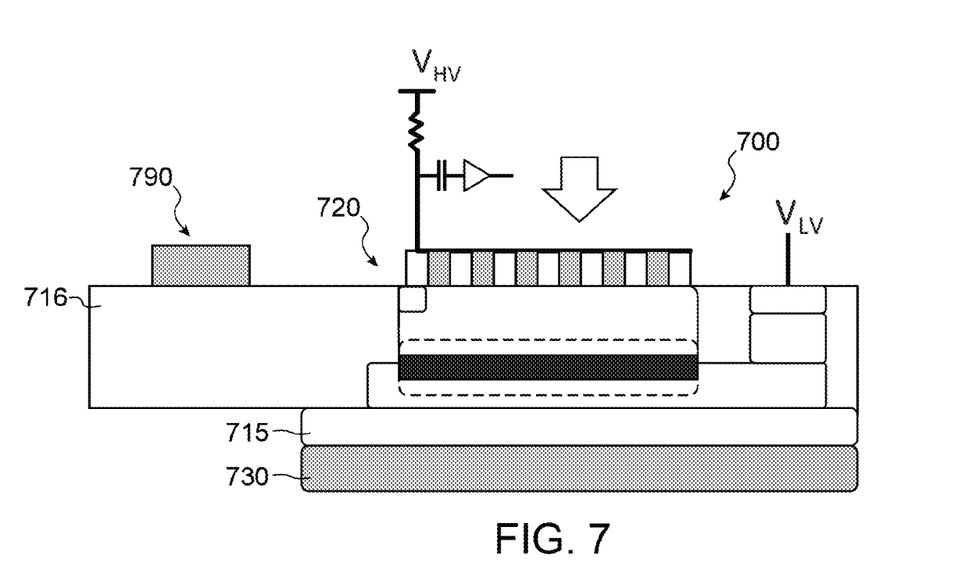
FIG. 7 illustrates a fourth embodiment of a photodiode according to the invention.

FIG. 7 illustrates a fourth embodiment of a photodiode 700 according to the invention.

The photodiode illustrated in FIG. 7 only differs from the embodiment of FIG. 5 in that the periodic structure 720 is not formed in the same block of silicon as the semiconductor material layer, but in a layer of a different material.

For example, after having produced by epitaxy the silicon layer 716 on a SOI, the assembly is covered by a layer of poly-crystalline silicon, in which will be etched the periodic structure according to the invention, and also serving as grid for a neighbouring transistor 790.

Figure 8:
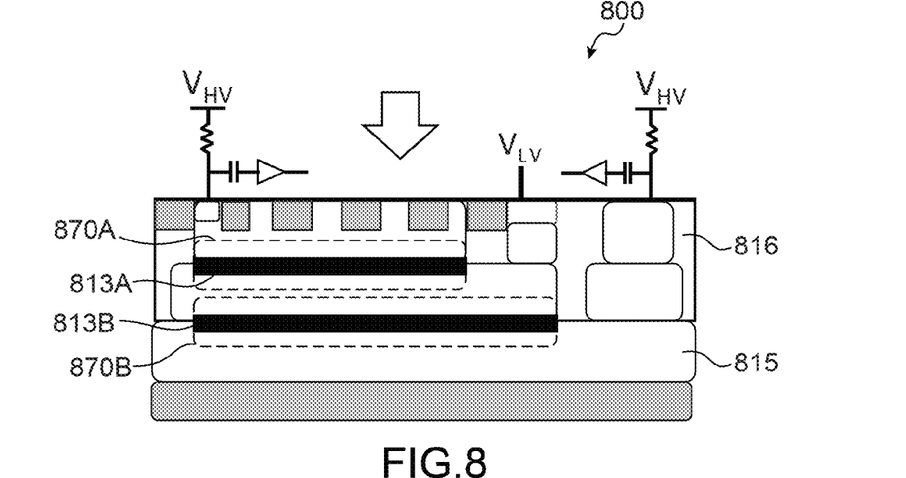
FIG. 8 illustrates a fifth embodiment of a photodiode according to the invention.

FIG. 8 illustrates a fifth embodiment of a photodiode 800 according to the invention.

The photodiode illustrated in FIG. 8 only differs from the embodiment of FIG. 5 in that it has two superimposed PN junctions, each associated with an avalanche zone 813A, 813B, and sharing a same intercalary doped zone.

In particular, a P doped zone is situated between two N doped zones, forming a PN junction on each side.

Figure 9:
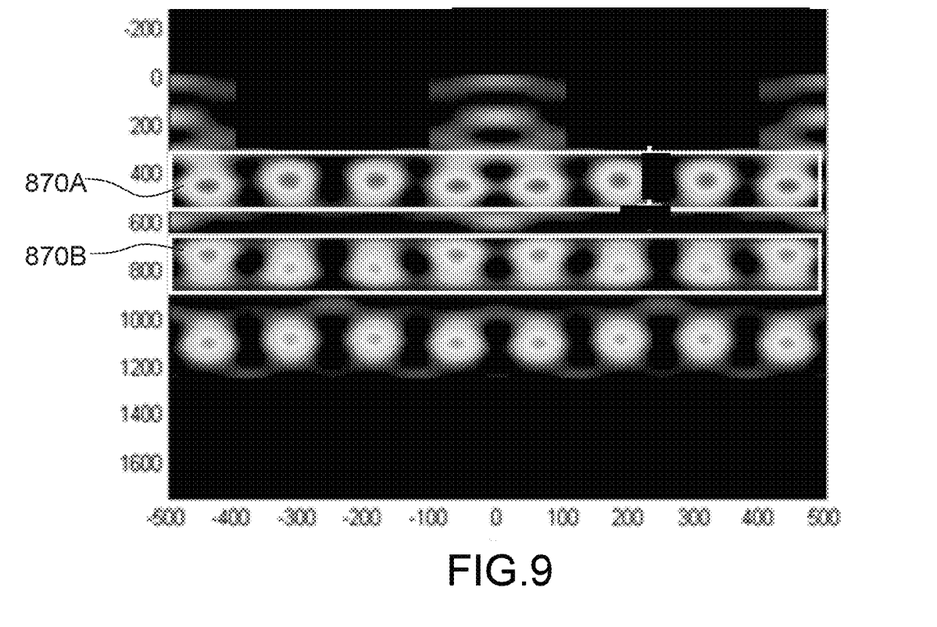
FIG. 9 illustrates a distribution of the absorption of light in the photodiode illustrated in FIG. 8.

The two PN junctions are each situated in a high sensitivity region 870A, 870B as described with reference to FIG. 3. These high sensitivity regions 870A, 870B are illustrated in FIG. 9, showing the distribution of electromagnetic field in the photodiode. The high sensitivity regions 870A, 870B are superimposed, and separated by a sub-layer in which the intensity of the electromagnetic field is very weak (average intensity at least 10 times less than in the regions 870A, 870B).

Such a photodiode is obtained by means of a method as illustrated in FIG. 5, the silicon layer 816 being this time weakly P doped, on an N doped silicon layer 815 and forming one among the two N doped zones.

The photodiode 800 thus forms a bi-spectral detector, each PN junction being dedicated to the detection of a different wavelength.

The invention is not limited to the examples described above, and numerous variants could be implemented without going beyond the scope of the present invention.

For example, the periodic structure could be in the form of a grid, complementary form of a square mesh of cubic pads.

The invention is particularly advantageous for a semiconductor material layer constituted of silicon, said material having low absorption, in particular in the red and the infrared. However, the invention is not limited to this semiconductor material or to these wavelengths.

The invention claimed is:

1. A single photodiode of single-photon avalanche diode (SPAD) type, comprising:
    a semiconductor material layer including an N doped zone and a P doped zone separated by an avalanche zone;
    a first low-index layer; and
    a periodic structure having a plurality of elementary patterns regularly spaced apart from each other,
    wherein the first low-index layer has a refractive index less than that of the semiconductor material layer and less than that of the periodic structure,
    wherein the semiconductor material layer is intercalated between the first low-index layer and the periodic structure, and
    wherein the periodic structure is deposited directly on the semiconductor material layer.

2. The single photodiode according to claim 1, wherein the periodic structure includes a plurality of pads regularly spaced apart from each other, and wherein spaces between pads of the plurality of pads are at least partially filled with a low-index material having a refractive index less than that of the semiconductor material layer and less than that of the periodic structure.

3. The single photodiode according to claim 1, wherein the periodic structure has an N doping or a P doping, and wherein one elementary pattern of the plurality of elementary patterns is connected to an electrical contact element, to polarize the photodiode.

4. The single photodiode according to claim 1, wherein the semiconductor material layer is made of silicon, and wherein the first low-index layer is made of silicon dioxide.

5. The single photodiode according to claim 1, wherein a difference between a refractive index of the semiconductor material layer and the refractive index of the first low-index layer is greater than or equal to 0.5.

6. The single photodiode according to claim 1, wherein the periodic structure has a pitch (P) comprised between 100 nm and 1000 nm.

7. The single photodiode according to claim 1, wherein a thickness of the semiconductor material layer is comprised between 0.5 μm and 3 μm.

8. The single photodiode according to claim 1, wherein a height of the elementary patterns is less than 1 μm.

9. The single photodiode according to claim 1, wherein the periodic structure includes a plurality of pads regularly spaced apart from each other, and wherein a ratio (a/P) of a width (a) of a pad among the plurality of pads, divided by a pitch (P) of the periodic structure is comprised between 0.25 and 0.80.

10. The single photodiode according to claim 1, wherein the periodic structure forms a two-dimensional network having a pitch (P) being identical in each of the two dimensions of the two-dimensional network.

11. The single photodiode according to claim 1, wherein the periodic structure and the semiconductor material layer are formed in a same semiconductor material block.

12. The single photodiode according to claim 1, wherein the periodic structure is formed in a polycrystalline silicon layer deposited on the semiconductor material layer.

13. An array of at least two photodiodes, each photodiode of the at least two photodiodes being a single photodiode of a single-photon avalanche diode (SPAD) type and comprising:
    a semiconductor material layer including an N doped zone and a P doped zone separated by an avalanche zone;
    a first low-index layer; and
    a periodic structure including a plurality of pads regularly spaced apart from each other,
    wherein the first low-index layer has a refractive index less than that of the semiconductor material layer and less than that of the periodic structure,
    wherein the semiconductor material layer is intercalated between the first low-index layer and the periodic structure,
    wherein the periodic structure and the semiconductor material layer are formed in a same semiconductor material block, such that the periodic structure is disposed directly on the semiconductor material layer,
    wherein spaces between pads of the plurality of pads are at least partially filled with a low-index material having a refractive index less than that of the semiconductor material layer and less than that of the periodic structure, and wherein neighboring periodic structures among the at least two photodiodes are separated by isolation trenches filled with the low-index material.

14. A method of manufacturing a single photodiode of single-photon avalanche diode (SPAD) type, comprising a semiconductor material layer including an N doped zone and a P doped zone separated by an avalanche zone, a first low-index layer, and a periodic structure having a plurality of elementary patterns regularly spaced apart from each other, the first low-index layer having a refractive index less than that of the semiconductor material layer and less than that of the periodic structure, the semiconductor material layer being intercalated between the first low-index layer and the periodic structure, the method comprising:

structuring an upper region of a semiconductor material block to form an assembly comprising the periodic structure mounted on the semiconductor material layer.

15. A method of manufacturing an array of at least two photodiodes, each photodiode of the at least two photodiodes being a single photodiode of a single-photon avalanche diode (SPAD) type and comprising a semiconductor material layer including an N doped zone and a P doped zone separated by an avalanche zone, a first low-index layer, and a periodic structure including a plurality of pads regularly spaced apart from each other, the first low-index layer having a refractive index less than that of the semiconductor material layer and less than that of the periodic structure, and the semiconductor material layer being intercalated between the first low-index layer and the periodic structure, the method comprising:

structuring an upper region of a semiconductor material block to form an assembly comprising periodic structures of the at least two photodiodes mounted on the semiconductor material layer;

etching trenches between neighboring periodic structures among the at least two photodiodes, the etching and the structuring being carried out by a single etching step; and filling the trenches and the spaces between the pads by depositing a low-index material having a refractive index less than that of the semiconductor material block.

16. A single photodiode configured to operate at a polarization voltage greater than or equal to, in absolute value, its breakdown voltage, and comprising:

a semiconductor material layer including an N doped zone and a P doped zone separated by an avalanche zone;

a first low-index layer; and a periodic structure having a plurality of elementary patterns regularly spaced apart from each other, wherein the first low-index layer has a refractive index less than that of the semiconductor material layer and less than that of the periodic structure, wherein the semiconductor material layer is intercalated between the first low-index layer and the periodic structure, and wherein the periodic structure is deposited directly on the semiconductor material layer.

17. A detection method implementing at least one single photodiode, the single photodiode comprising:

a semiconductor material layer including an N doped zone and a P doped zone separated by an avalanche zone;

a first low-index layer;

a periodic structure having a plurality of elementary patterns regularly spaced apart from each other;

the first low-index layer having a refractive index less than that of the semiconductor material layer and less than that of the periodic structure;

the semiconductor material layer being intercalated between the first low-index layer and the periodic structure, and the periodic structure being deposited directly on the semiconductor material layer; and the method comprising:

operating the single photodiode at a polarization voltage greater than or equal to, in absolute value, its breakdown voltage.

* * * * *